United States Patent
Chen et al.

(10) Patent No.: US 7,612,984 B2
(45) Date of Patent: Nov. 3, 2009

(54) LAYOUT FOR CAPACITOR PAIR WITH HIGH CAPACITANCE MATCHING

(75) Inventors: Chia-Yi Chen, Hsinchu (TW); Chung-Long Chang, Dou-Liu (TW); Chih-Ping Chao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 303 days.

(21) Appl. No.: 11/591,643

(22) Filed: Nov. 1, 2006

(65) Prior Publication Data

US 2008/0100989 A1    May 1, 2008

(51) Int. Cl.
*H01G 4/06*     (2006.01)
*H01G 4/005*    (2006.01)

(52) U.S. Cl. .................................. 361/311; 361/303
(58) Field of Classification Search ......... 361/303–305, 361/311
See application file for complete search history.

(56) References Cited

U.S. PATENT DOCUMENTS

| | | | |
|---|---|---|---|
| 2003/0183864 A1 | 10/2003 | Miyazawa | |
| 2004/0031982 A1 | 2/2004 | Devries et al. | |
| 2007/0001203 A1* | 1/2007 | Lehr et al. | 257/296 |
| 2008/0012092 A1* | 1/2008 | Liang et al. | 257/532 |
| 2008/0099879 A1* | 5/2008 | Chen et al. | 257/532 |

* cited by examiner

*Primary Examiner*—Eric Thomas
(74) *Attorney, Agent, or Firm*—Slater & Matsil, L.L.P.

(57) ABSTRACT

An integrated circuit device includes a capacitor array, which includes unit capacitors arranged in rows and columns, wherein each unit capacitor is formed of two electrically insulated capacitor plates. The unit capacitors include at least one first unit capacitor in each row and in each column of the capacitor array; the at least one first unit capacitor being interconnected, wherein each row of the capacitor array comprises a same number of the at least one first unit capacitors as other rows and columns have, and wherein each column of the capacitor array comprises a same number of the at least one first unit capacitors as other rows and columns have. The unit capacitors further include at least one second unit capacitor in each row and in each column of the capacitor array, wherein the at least one second unit is interconnected and evenly distributed throughout the array.

19 Claims, 6 Drawing Sheets

| 3 | 2 | 1 |
|---|---|---|
| 2 | 1 | 3 |
| 1 | 3 | 2 |

| 2 | 3 | 1 |
|---|---|---|
| 1 | 2 | 3 |
| 3 | 1 | 2 |

| 1 | 2 | 3 |
|---|---|---|
| 3 | 1 | 2 |
| 2 | 3 | 1 |

· · · · · · ·

| C1 | C2 | C2 | C2 | C2 | • • • |
|----|----|----|----|----|-------|
| C2 | C1 | C2 | C2 | C2 | • • • |
| C2 | C2 | C1 | C2 | C2 | • • • |
| C2 | C2 | C2 | C1 | C2 | • • • |
| C2 | C2 | C2 | C2 | C1 | • • • |

Fig. 5

| C1 | C2 | C1 | C2 | C2 |
|---|---|---|---|---|
| C2 | C1 | C2 | C1 | C2 |
| C2 | C2 | C1 | C2 | C1 |
| C1 | C2 | C2 | C1 | C2 |
| C2 | C1 | C2 | C2 | C1 |

Fig. 6

| 6 | 5 | 4 | 3 | 2 | 1 |
|---|---|---|---|---|---|
| 5 | 4 | 3 | 2 | 1 | 6 |
| 4 | 3 | 2 | 1 | 6 | 5 |
| 3 | 2 | 1 | 6 | 5 | 4 |
| 2 | 1 | 6 | 5 | 4 | 3 |
| 1 | 6 | 5 | 4 | 3 | 2 |

| 4 | 6 | 2 | 5 | 1 | 3 |
|---|---|---|---|---|---|
| 3 | 5 | 1 | 4 | 6 | 2 |
| 2 | 4 | 6 | 3 | 5 | 1 |
| 1 | 3 | 5 | 2 | 4 | 6 |
| 6 | 2 | 4 | 1 | 3 | 5 |
| 5 | 1 | 3 | 6 | 2 | 4 |

LAYOUT FOR CAPACITOR PAIR WITH HIGH CAPACITANCE MATCHING

TECHNICAL FIELD

This invention relates generally to integrated circuit devices, and more particularly to layouts of capacitor pairs having specified capacitance ratios.

BACKGROUND

In modern integrated circuits, such as circuits for mixed-mode and radio frequency applications, a pair of capacitors with a specific capacitance ratio (often referred to as 1:N capacitors, wherein N is an integer greater than zero) is often needed. The ratio of capacitances typically needs to have high accuracy for the integrated circuit to work accurately. For example, in analog/digital (A/D) converters, the accuracy of the capacitor pair determines the accuracy of the resulting digital signals, and thus a very high accuracy of capacitance ratio is required.

FIG. 1 illustrates a conventional circuit for providing 1:N capacitor pairs. The circuit includes an array of unit capacitors designed to have identical capacitances. An X-decoder and a Y-decoder are connected to the capacitor array and are used to select a number of unit capacitors from the capacitor array. By parallel connecting the selected unit capacitors, capacitors with greater capacitances can be formed. The exemplary array illustrated in FIG. 1 has nine unit capacitors, and thus can be used to achieve any ratio between 1:1 and 1:9, wherein the number 1 represents one unit capacitor, and the number 9 represents a capacitor formed by parallel connecting all nine unit capacitors.

The circuit illustrated in FIG. 1 has the advantageous feature of being able to dynamically provide a capacitor pair. However, some drawbacks limit its usage. For example, the formation of the capacitor array is process sensitive. Although all the unit capacitors are designed to be identical, some of the unit capacitors may be physically close to a pattern-sparse region, and some other unit capacitors may be physically close to a pattern-dense region. As a result, the capacitances of the unit capacitors have variations, which affect the accuracy of the capacitor pairs. Typically, capacitor arrays with greater numbers of unit capacitors have greater capacitance variations.

An additional drawback is that the X-decoder and Y-decoder consume chip area. Particularly, for 1:N capacitors wherein N is small, the chip area penalty is significant compared to the relatively small area occupied by the unit capacitors. Accordingly, capacitor pairs with improved accuracy and less chip area penalty are required.

SUMMARY OF THE INVENTION

In accordance with one aspect of the present invention, an integrated circuit device includes a capacitor array, which includes unit capacitors arranged in rows and columns, wherein each unit capacitor is formed of two electrically insulated capacitor plates. The unit capacitors include at least one first unit capacitor in each row and each column of the capacitor array, the at least one first unit capacitor being interconnected, wherein each row of the capacitor array comprises a same number of the at least one first unit capacitors as other rows and columns do, and wherein each column of the capacitor array comprises a same number of the at least one first unit capacitors as other rows and columns. The unit capacitors further include at least one second unit capacitor in each row and each column of the capacitor array; the at least one second unit capacitor being interconnected, wherein each row of the capacitor array comprises a same number of the at least one second unit capacitors as other rows and columns do, and wherein each column of the capacitor array comprises a same number of the at least one second unit capacitors as other rows and columns.

In accordance with another aspect of the present invention, an integrated circuit device includes a common node comprising a conductive bus and a plurality of first fingers connected to the first bus; a plurality of second fingers, each being between and electrically insulated from two of the first fingers; a second conductive bus interconnecting the plurality of second fingers; a plurality of third fingers, each being between and electrically insulated from two of the first fingers; and a third conductive bus interconnecting the plurality of third fingers, wherein the plurality of first fingers, the plurality of second fingers and the plurality of third fingers are metal lines in a metallization layer. The plurality of second fingers and the plurality of third fingers form an array with rows and columns, wherein, in each row and in each column, a number of the second fingers is equal to a number of the second fingers in other rows and columns, and wherein, in each row and in each column, a number of the third fingers is equal to a number of the third fingers in other rows and columns.

In accordance with yet another aspect of the present invention, a capacitor pair includes a common node comprising a conductive bus and a plurality of first fingers connected to the first bus; a number of M*(M+N) second fingers, each second finger being between and electrically insulated from two of the first fingers, wherein M and N are non-zero integers; a second conductive bus interconnecting the second fingers; a number of N*(M+N) third fingers, each being between and electrically insulated from two of the first fingers, and a third conductive bus interconnecting the third fingers. The first fingers, the second fingers and the third fingers are metal lines in a metallization layer. The second fingers and the third fingers form an array with M+N rows and M+N columns, wherein, in each row and in each column, there are M second fingers and N third fingers.

The advantageous features of the present invention include reduced process sensitivity and increased accuracy in capacitor ratio.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 schematically illustrates an expandable layout of 1:N capacitor pairs;

FIG. 6 illustrates a layout of a 2:3 capacitor pair;

FIG. 7 schematically illustrates possible layouts of 1:2:3 capacitors; and

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
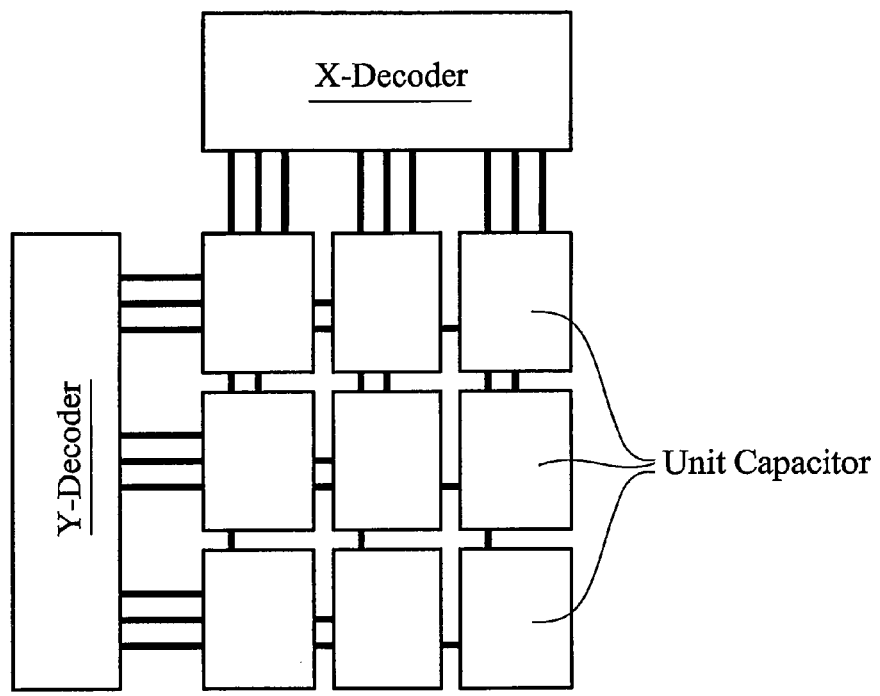
FIG. 1 illustrates a conventional circuit for providing capacitor pairs, wherein a unit capacitor array is used to form capacitors with greater capacitances.
Figure 2:
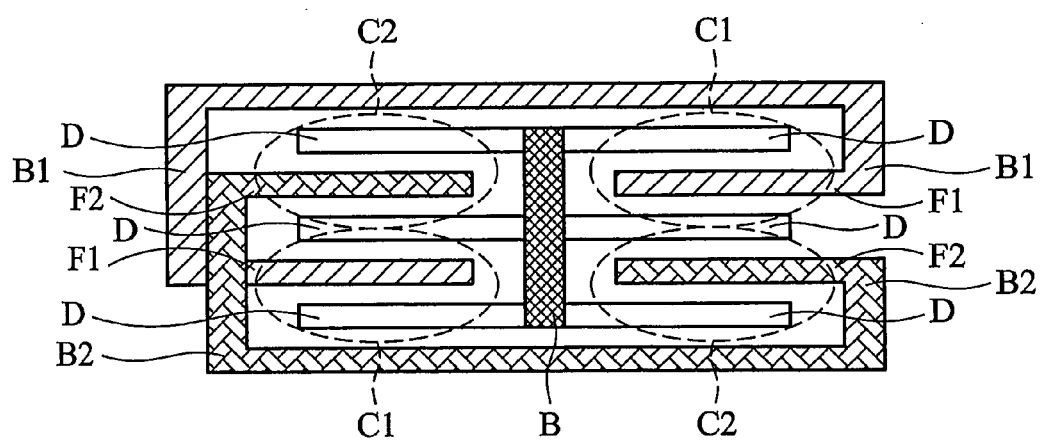
FIG. 2 illustrates a top view of a 1:1 capacitor pair.

FIG. 2 illustrate a top view of a first embodiment of the present invention, which includes four unit capacitors arranged as a two-by-two array. Two of the unit capacitors are marked as C1 and the other two unit capacitors are marked as C2. Unit capacitors C1 are formed between metal lines (also referred to as fingers) F1 and fingers D, wherein fingers D are interconnected by a bus B to form a common node. Unit capacitors C2 are formed between fingers F2 and fingers D. Unit capacitors C1 are interconnected to form one great capacitor, and unit capacitors C2 are interconnected to form another great capacitor.

In the preferred embodiment, unit capacitors C1 and C2 are arranged in such a way that in each row of the array, there is one and only one C1, and in each column of the array, there is one and only one C1. Similarly, there is one and only one C2 in each row of the array, and there is one and only one C2 in each column of the array. The embodiment shown in FIG. 2 is thus a 1:1 capacitor pair. The centroid of capacitors C1 and centroid of capacitors C2 substantially overlap.

Figures 3A, 3B:
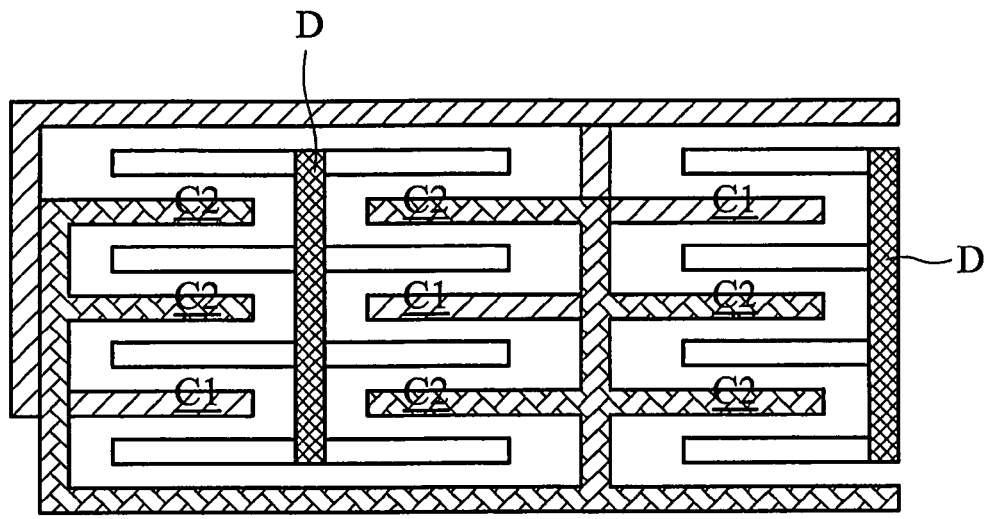
FIG. 3A illustrates a top view of a 1:2 capacitor pair.
FIG. 3B illustrates possible layouts of unit capacitors for forming 1:2 capacitor pairs.

FIG. 3A illustrates a top view of a 1:2 capacitor pair, which includes nine unit capacitors arranged as a three-by-three array. Three of the unit capacitors are marked as C1 and the remaining six unit capacitors are marked as C2. Unit capacitors C1 are interconnected to form a first great capacitor, and unit capacitors C2 are interconnected to form a second great capacitor, which has a capacitance two times greater than the capacitance of the first great capacitor.

In the preferred embodiment, unit capacitors C1 and C2 are arranged in such a way that in each row and each column of the array, there is one and only one unit capacitor C1. In each row and each column of the array, there are two and only two unit capacitors C2. The centroid of unit capacitors C1 and the centroid of unit capacitors C2 substantially overlap. FIG. 3A only illustrates one layout of the unit capacitors, and more possible layouts are schematically shown in FIG. 3B. In each of the layouts, each number only appears in one row once, and in one column once. Such layouts are often referred to as Latin squares. To form a 1:2 capacitor pair, all unit capacitors marked in number 1 may be parallel interconnected, and all capacitors marked in numbers 2 and 3 may be parallel interconnected.

Figures 4A, 4B:
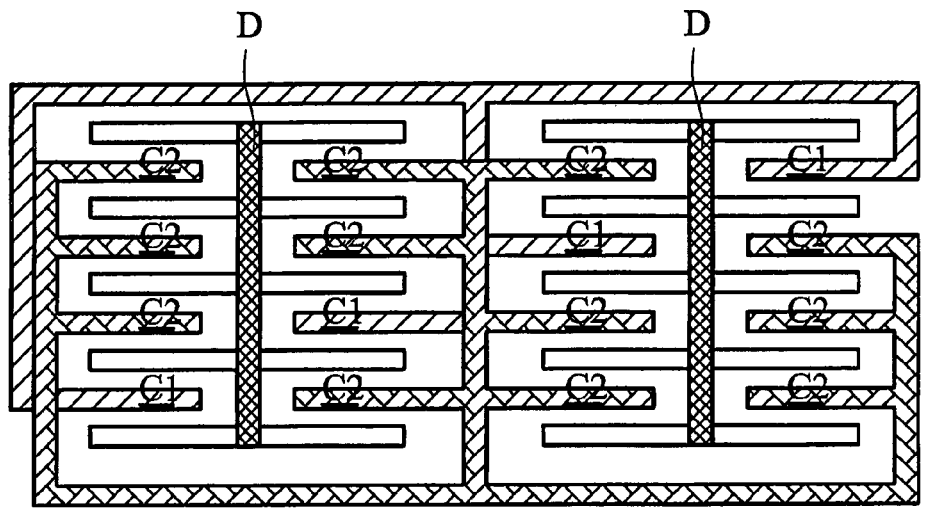
FIG. 4A illustrates a top view of a 1:3 capacitor pair.
FIG. 4B illustrates possible layouts of unit capacitors for forming 1:3 capacitor pairs.

FIG. 4A illustrates a top view of a 1:3 capacitor pair, which includes 16 unit capacitors arranged as a four-by-four array. Four of the unit capacitors are marked as C1 and the remaining 12 unit capacitors are marked as C2. Unit capacitors C1 are interconnected to form one great capacitor, and unit capacitors C2 are interconnected to form another great capacitor, which has a capacitance three times greater than the capacitance of the great capacitor formed of unit capacitors C1. Similar to 1:1 and 1:2 capacitor pairs, in the preferred embodiment, unit capacitors C1 and C2 are arranged in such a way that in each row and each column of the array, there is one and only one unit capacitor C1. In each row and each column of the array, there are two and only two unit capacitors C2. The centroid of capacitors C1 and the centroid of capacitors C2 preferably substantially overlap. FIG. 4B illustrates more possible layouts for forming the 1:3 capacitor pair. In each of the possible layouts, each of the numbers 1, 2, 3 and 4 appears in each row only once and in each column only once. To form a 1:3 capacitor pair, all unit capacitors marked as number 1 are interconnected, and all unit capacitors marked as numbers 2, 3 and 4 are interconnected.

FIG. 5 illustrates a preferred layout of 1:N capacitor pairs, wherein N is an integer greater than three. The same principle applies so that each unit capacitor C1 appears once and only once in each row and column. By increasing the number N, hence expanding the unit capacitor array, capacitor pairs with greater capacitance ratios can be formed. It should be appreciated that FIG. 5 only illustrates one possible layout. One skilled in the art can determine more layouts by referring to FIGS. 3B and 4B. Preferably, in these layouts, the centroid of unit capacitors C1 substantially overlaps the centroid of unit capacitors C2.

Capacitor pairs with a M:N ratio can also be laid out by using the teaching provided in the preceding paragraphs, wherein M and N are non-zero integers (greater than zero). In the preferred embodiment, such capacitor pairs are preferably laid out as arrays having M+N rows and M+N columns. In each row and in each column, there are M and only M interconnected unit capacitors C1. In each row and in each column, there are N and only N interconnected unit capacitors C2. Preferably, in each row and in each column, each unit capacitor C1 is located as far as possible from other unit capacitors C1 in the same row and column, and each unit capacitor C2 is located as far as possible from other unit capacitors C2 in the same row and column. In other words, unit capacitors C1 and C2 are preferably evenly distributed in each row and each column. Furthermore, unit capacitors C1 and C2 are preferably evenly distributed throughout the array. For example, if number M is close to number N, unit capacitors C1 and C2 can be laid out substantially alternately. An exemplary layout of a 2:3 capacitor pair is illustrated in FIG. 6.

More than one capacitor pair can be integrated in one array. FIG. 7 illustrates two exemplary layouts of a six-by-six unit capacitor array, which can be used to form a 1:2 capacitor pair, a 1:3 capacitor pair and a 2:3 capacitor pair. In an exemplary embodiment, all unit capacitors marked as number "1" are interconnected to form a first capacitor, all unit capacitors marked as numbers "2" and "3" are interconnected to form a second capacitor, and all unit capacitors marked as numbers "4," "5," and "6" are interconnected to form a third capacitor. The first, second and third capacitors thus have a ratio of 1:2:3. Using the same principle as taught in previous paragraphs, a M:N capacitor pair, a M:P capacitor pair, and a N:P capacitor pair can be formed by forming a unit capacitor array with M+N+P rows and M+N+P columns. Preferably, each group of interconnected unit capacitors is evenly distributed in each row and each column and across the array.

Figure 8:
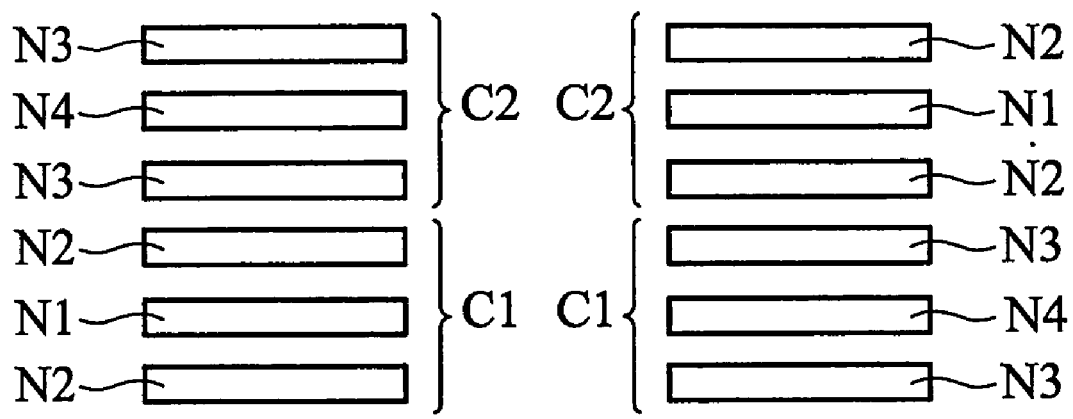
FIG. 8 illustrates a top view of a 1:1 capacitor pair, wherein two capacitors in the capacitor pair have no common node.

In the preferred embodiment, the two capacitors in a capacitor pair share a common node (refer to Node D in FIGS. 2, 3A and 4A), so that less chip area is required. In alternative embodiments, unit capacitors C1 and C2 are electrically separated from each other with no common node. An exemplary embodiment is illustrated in FIG. 8, which shows a 1:1 capacitor pair. Each of the unit capacitors C1 includes a first capacitor N1 and a second capacitor plate N2, and each of the unit capacitors C2 includes a first capacitor N3 and a second capacitor plate N4. Each of the capacitor plates N1, N2, N3 and N4 are connected to other capacitor plates marked with the same number. It is noted that compared to the layout shown in FIG. 2, more capacitor plates, hence greater chip areas, are needed.

Preferably, the capacitors discussed in the preceding paragraphs are implemented as metal-oxide-metal (MOM) capacitors. An exemplary embodiment for forming the MOM capacitors is explained using FIG. 2, which may be a top view of a metallization layer used for forming an interconnect structure of a semiconductor chip. Each of the conductive fingers F1, F2 and D are closely located with a thin insulator therebetween, and capacitances are formed between the neighboring fingers. The connecting buses B1 and B2 may be formed in the same metallization layer as fingers F1, F2 and D. Alternatively, connecting buses B1 and B2 are formed in different metallization layers and are connected to the respective fingers F1, F2 and D through vias.

Although in the previously discussed embodiments, unit capacitors are formed in one metallization layer, they can be spread to several metallization layers and interconnected by vias. For example, a capacitor pair may include more than one capacitor array, and each array may be similar to what is illustrated in FIGS. 2, 3A and 4A. These capacitor arrays may be in one metallization layer or distributed in several metallization layers. The capacitor arrays in different metallization layers are interconnected, either in parallel or in series.

An advantageous feature of the preferred embodiments is that the process variations, such as the variation caused by pattern density differences, is at least reduced, and possibly substantially eliminated. For example, if a unit capacitor C1 has a greater capacitance than other unit capacitors due to a higher or a lower pattern density, a neighboring unit capacitor C2 will also likely have a greater capacitance, and thus the adverse effect to the ratio of the capacitor pair is reduced. In particular, the greater the number N is, the smaller the variation in capacitance ratio. This is contrary to the conventional capacitor pairs with decoders, which most likely have greater variations when the number N increases.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device comprising:
   a capacitor array comprising unit capacitors arranged in rows and columns, wherein each unit capacitor is formed of two electrically insulated capacitor plates;
   at least one first unit capacitor in each row and in each column of the capacitor array, the at least one first unit capacitor being interconnected, wherein each row of the capacitor array comprises a same number of the at least one first unit capacitors as other rows and columns have, and wherein each column of the capacitor array comprises a same number of the at least one first unit capacitors as other rows and columns have; and
   more than one second unit capacitor in each row and in each column of the capacitor array, the more than one second unit capacitor being interconnected, wherein each row of the capacitor array comprises a same number of the more than one second unit capacitors as other rows and columns have, and wherein each column of the capacitor array comprises a same number of the more than one second unit capacitors as other rows and columns have.

2. The integrated circuit device in claim 1, wherein, in each row and in each column, there is only one of the at least one first unit capacitor.

3. The integrated circuit device in claim 1, wherein the at least one first unit capacitor and the more than one second unit capacitor share a common node.

4. The integrated circuit device in claim 1, wherein the at least one first unit capacitor and the more than one second unit capacitor have no common node.

5. The integrated circuit device in claim 1, wherein the capacitor array is formed in one metallization layer, and wherein each of the at least one first unit capacitors and the more than one second unit capacitors are formed between sidewalls of metal fingers.

6. An integrated circuit device comprising:
   a capacitor array comprising unit capacitors arranged in rows and columns, wherein each unit capacitor is formed of two electrically insulated capacitor plates;
   at least one first unit capacitor in each row and in each column of the capacitor array, the at least one first unit capacitor being interconnected, wherein each row of the capacitor array comprises a same number of the at least one first unit capacitors as other rows and columns have, and wherein each column of the capacitor array comprises a same number of the at least one first unit capacitors as other rows and columns have;
   at least one second unit capacitor in each row and in each column of the capacitor array, the at least one second unit capacitor being interconnected, wherein each row of the capacitor array comprises a same number of the at least one second unit capacitors as other rows and columns have, and wherein each column of the capacitor array comprises a same number of the at least one second unit capacitors as other rows and columns have; and
   at least one third unit capacitor in each row and in each column of the capacitor array, the at least one third unit capacitor being interconnected, wherein each row of the capacitor array comprises a same number of the at least one third unit capacitors as other rows and columns have, and wherein each column of the capacitor array comprises a same number of the at least one third unit capacitors as other rows and columns have.

7. The integrated circuit device in claim 6, wherein the at least one first unit capacitor and the at least one second unit capacitor form a first capacitor pair, the at least one second unit capacitor and the at least one third unit capacitor form a second capacitor pair, and the at least one third unit capacitor and the at least one first unit capacitor form a third capacitor pair.

8. An integrated circuit device comprising:
   a capacitor array comprising unit capacitors arranged in rows and columns, wherein each unit capacitor is formed of two electrically insulated capacitor plates;
   at least one first unit capacitor in each row and in each column of the capacitor array, the at least one first unit capacitor being interconnected, wherein each row of the capacitor array comprises a same number of the at least one first unit capacitors as other rows and columns have, and wherein each column of the capacitor array comprises a same number of the at least one first unit capacitors as other rows and columns have;

at least one second unit capacitor in each row and in each column of the capacitor array, the at least one second unit capacitor being interconnected, wherein each row of the capacitor array comprises a same number of the at least one second unit capacitors as other rows and columns have, and wherein each column of the capacitor array comprises a same number of the at least one second unit capacitors as other rows and columns have;

at least one third unit capacitor connected to the at least one first unit capacitor; and at least one fourth unit capacitor connected to the at least one second unit capacitor, wherein the at least one third unit capacitor and the at least one fourth unit capacitor form an additional array, and wherein the at least one first unit capacitor is parallel connected to the at least one third unit capacitor, and the at least one second unit capacitor is parallel connected to the at least one fourth unit capacitor.

9. The integrated circuit device in claim 8, wherein the array and the additional array are in a same metallization layer.

10. The integrated circuit device in claim 8, wherein the array and the additional array are in different metallization layers.

11. The integrated circuit device in claim 8, wherein, in a same row or in a same column, the at least one first unit capacitor and the at least one second unit capacitor are substantially evenly distributed.

12. An integrated circuit device comprising:
a common node comprising a first conductive bus and a plurality of first fingers connected to the first conductive bus;
a plurality of second fingers, each being between and electrically insulated from two of the first fingers;
a second conductive bus interconnecting the plurality of second fingers;
a plurality of third fingers, each being between and electrically insulated from two of the first fingers;
a third conductive bus interconnecting the plurality of third fingers, wherein the plurality of first fingers, the plurality of second fingers, and the plurality of third fingers are metal lines in a metallization layer; and
wherein the plurality of second fingers and the plurality of third fingers form an array with rows and columns, wherein, in each row and in each column, a number of the second fingers is equal to a number of the second fingers in other rows and columns, and wherein, in each row and in each column, a number of the third fingers is equal to a number of the third fingers in other rows and columns.

13. The integrated circuit device of claim 12, wherein at least a portion of the second and the third conductive buses are formed in a different metallization layer than the first and the second plurality of fingers.

14. The integrated circuit device of claim 12, wherein there is only one of the second fingers in each row and in each column.

15. The integrated circuit device of claim 14, wherein there is more than one of the third fingers in each row and in each column.

16. The integrated circuit device of claim 12 further comprising a plurality of fourth fingers, wherein each of the fourth fingers is between and electrically insulated from two of the first fingers, and wherein, in each row and in each column, a number of the fourth fingers is equal to a number of the fourth fingers in other rows and columns.

17. A capacitor pair comprising:
a common node comprising a first conductive bus and a plurality of first fingers connected to the first conductive bus;
a number of M*(M+N) second fingers, each second finger being between and electrically insulated from two of the first fingers, wherein M and N are non-zero integers;
a second conductive bus interconnecting the second fingers;
a number of N*(M+N) third fingers, each being between and electrically insulated from two of the first fingers;
a third conductive bus interconnecting the third fingers, wherein the first fingers, the second fingers, and the third fingers are metal lines in a metallization layer; and
wherein the second fingers and the third fingers form an array with M+N rows and M+N columns, wherein, in each row and in each column, there are M second fingers and N third fingers.

18. The capacitor pair of claim 17, wherein M is one and N is greater than one.

19. The capacitor pair of claim 17, wherein a centroid of the first fingers and a centroid of the second fingers substantially overlap.

* * * * *